(12) United States Patent
Salem et al.

(10) Patent No.: US 10,348,300 B2
(45) Date of Patent: Jul. 9, 2019

(54) MULTI-LEVEL ADIABATIC CHARGING METHODS, DEVICES AND SYSTEMS

(71) Applicant: The Regents of the University of California, Oakland, CA (US)

(72) Inventors: Loai Galal Bahgat Salem, La Jolla, CA (US); Patrick Mercier, San Diego, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 15/887,178

(22) Filed: Feb. 2, 2018

(65) Prior Publication Data

US 2018/0226969 A1 Aug. 9, 2018

Related U.S. Application Data

(60) Provisional application No. 62/454,217, filed on Feb. 3, 2017.

(51) Int. Cl.
*H03K 19/00* (2006.01)
*H03K 3/012* (2006.01)
(Continued)

(52) U.S. Cl.
CPC ......... *H03K 19/0019* (2013.01); *G11C 5/147* (2013.01); *G11C 11/4074* (2013.01);
(Continued)

(58) Field of Classification Search
CPC ............. H02M 3/335; H02M 3/33515; H02M 3/3353; H02M 3/3374; H02M 3/07;
(Continued)

(56) References Cited

U.S. PATENT DOCUMENTS

| | | | | |
|---|---|---|---|---|
| 7,030,672 B2* | 4/2006 | Nakata | ................... | H03K 3/012 327/199 |
| RE42,066 E * | 1/2011 | Svensson | ................ | H02M 3/07 307/109 |
| 8,693,225 B2* | 4/2014 | Yoshino | ............... | B41J 2/04541 363/65 |

OTHER PUBLICATIONS

Chan et al., "A 4.6GHz Resonant Global Clock Distribution Network", 2004 IEEE International Solid-State Circuits Conference, Feb. 18, 2004.
(Continued)

*Primary Examiner* — An T Luu
(74) *Attorney, Agent, or Firm* — Greer, Burns & Crain, Ltd.; Steven P. Fallon

(57) ABSTRACT

A method for adiabatic charging of a capacitive load sequentially connects outer switches between a voltage $V_{DD}$ and ground and inner switches to at least one capacitance that self-balances between $V_{DD}$ and ground. A voltage waveform is provided to the capacitive load from a common node of the outer switches and the inner switches. An adiabatic charging circuit includes outer transistor switches between a voltage $V_{DD}$ and ground. Inner transistor switches are connected to at least one capacitance that self-balances between $V_{DD}$ and ground. A control signal generating circuit generates control signals for the inner and outer transistor switches that sequentially turn the inner and outer switches on and off to create a multi-level voltage staircase waveform at a common node of the inner and outer transistor switches.

11 Claims, 10 Drawing Sheets

(51) Int. Cl.
  *H03K 19/017* (2006.01)
  *G11C 11/4074* (2006.01)
  *H03K 19/096* (2006.01)
  *G11C 5/14* (2006.01)

(52) U.S. Cl.
  CPC ....... *H03K 19/017* (2013.01); *H03K 19/0963* (2013.01); *H03K 3/012* (2013.01)

(58) Field of Classification Search
  CPC .......... G11C 5/147; H03K 3/012; H03K 4/02; H03K 4/023; H03K 4/026; H03K 4/06; H03K 4/063; H03K 19/0019; H03K 19/0013; H03K 19/0016
  See application file for complete search history.

(56) References Cited

OTHER PUBLICATIONS

Fuketa et al., "Intermittent Resonant Clocking Enabling Power Reduction at any Clock Frequency for 0.37V 980kHz Near-Threshold Logic Circuits", 2013 IEEE International Solid-State Circuits Conference, Feb. 20, 2013.

Rahman et al., "Voltage-Scalable Frequency-Independent Quasi-Resonant Clocking Implementation of a 0.7-to-1.2V DVFS System", 2016 IEEE International Solid-State Circuits Conference, Feb. 3, 2016.

Restle et al., "Wide-Frequency-Range Resonant Clock with On-the-Fly Mode Changing for the POWER8 Microprocessor", 2014 IEEE International Solid-State Circuits Conference, Feb. 10, 2014.

\* cited by examiner

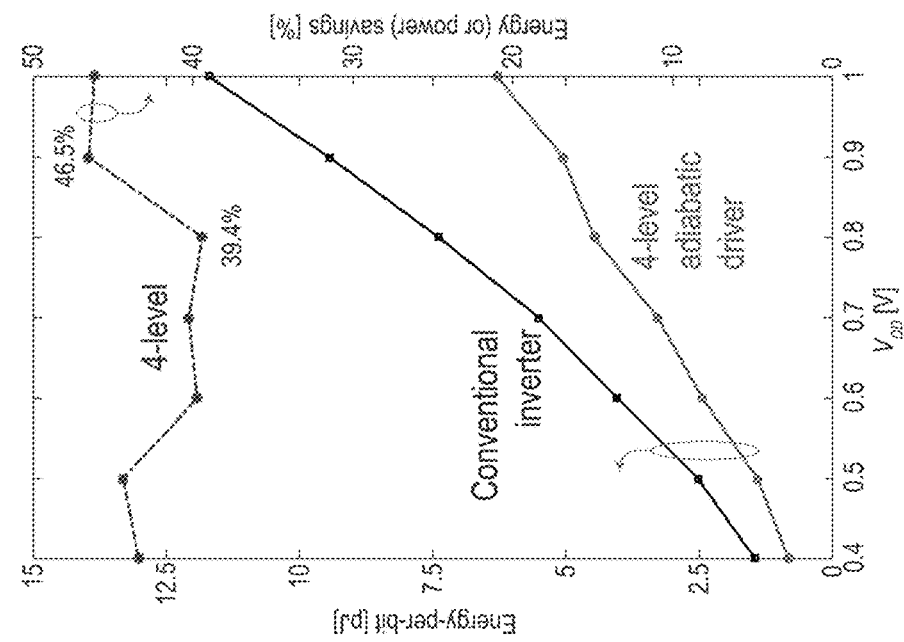
FIG. 5C
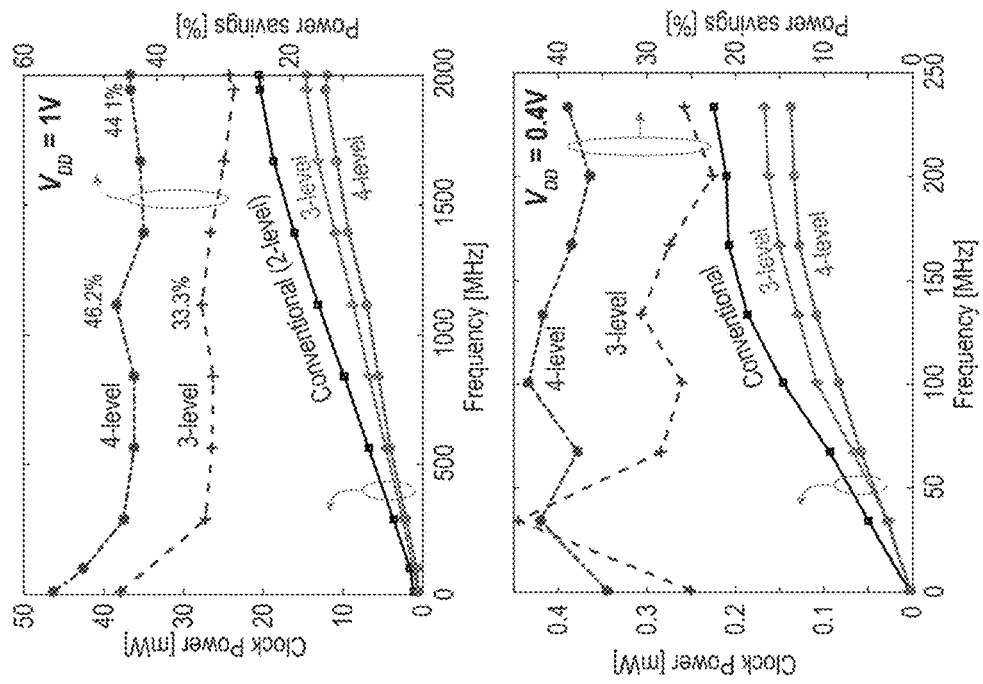
FIG. 5A
FIG. 5B

| | ISSCC'04 [1] | ISSCC'13 [3] | ISSCC'14 [2] | ISSCC'16 [4] | This Work |
|---|---|---|---|---|---|
| Process | 90nm | 40nm | 22nm SOI | 65nm | 45nm SOI |
| Power reduction methodology | LC resonance | LC resonance | LC resonance | LC resonance | Step-wise charging |
| Inductor | four 1nH per CLK sector (on-chip) | 7µH (off-chip) | 57 CLK sectors, each with 2 inductors from 0.3-2.5nH (on-chip) | ~7nH (off-chip) | None |
| Area | N.R. | N.R. | N.R. | 0.04mm² (not including inductor) | 0.019mm² (6.2% of $A_{LOAD}$) |
| Power reduction | 20% | 36% | 25 – 33% | 32 – 47% | 26.2 – 55.6% (average = 41.8%) |
| Frequency range with power reduction | 2.6 – 4.6GHz | 0.98MHz* | 2.5 – 5GHz | 10 – 152MHz | 1MHz – 2GHz |
| Dynamic frequency range | 1.8x | N/A | 2x | 15.2x | 2,000x |
| Voltage range | 1V | 0.37V** | 0.75 – 1.08V (1.44x) | 0.7 – 1.2V (1.7x) | 0.4** – 1V (2.5x) |
| Duty-cycle control | No | No | Limited | Yes | Yes |
| Clock capacitance | 7.5pF | 10pF | N.R. | N.R. | 15pF |
| CLK granularity | Global only | Global only | Global only | Global only | Global + local |

* Low frequency range not reported    N.R. = Not Reported
**Near-threshold operation

MULTI-LEVEL ADIABATIC CHARGING METHODS, DEVICES AND SYSTEMS

PRIORITY CLAIM AND REFERENCE TO RELATED APPLICATION

The application claims priority under 35 U.S.C. § 119 from prior provisional application Ser. No. 62/454,217, which was filed Feb. 3, 2017.

FIELD

Fields of the invention include charging methods devices and systems. Particular applications of the invention include charging of capacitive loads, including in system-on-a chip (SoC) systems. Example capacitive loads include clock trees, I/O pads, bioelectronic stimulators, etc.

BACKGROUND

Charging a capacitive load from a voltage source invokes a ½ $CV^2$ energy penalty. The concept of adiabatic charging, where the capacitor is charged more slowly than nominally afforded by the natural RC time constant of the charging circuit in the pursuit of reducing energy dissipation to below ½ $CV^2$, has been contemplated for decades. Despite the interest in adiabatic charging, there has not been any solution to enabling this slow charging phenomenon in a practical, low-overhead charging circuit. For example, prior work used separate DC-DC converters to provide multiple voltage levels, or used resonant inductors, both of which invoke significant area overhead.

Capacitive load charging consumes a significant amount of power budget in system-on-a-chip (SoC) systems. As an example, clock distribution in modern SoCs consumes a significant fraction of total chip power. To reduce clock distribution power, resonant clocking schemes, where an inductive reactance is used to cancel the capacitive reactance of global clock networks at a given resonance frequency, $f_o$, have been proposed. Conventionally, such schemes are only suitable at high multi-GHz frequencies in order to be able to place the employed inductors on chip. See, e.g. S. Chan et al., "A 4.6 GHz Resonant Global Clock Distribution Network," *ISSCC Dig. Tech. Papers*, 2004; P. Restle et al., "Wide-Frequency-Range Resonant Clock with On-The-Fly Mode Changing for the POWER8™ Microprocessor," *ISSCC Dig. Tech. Papers*, 2014.

Since many modern energy-efficient SoC designs optimize for clock frequencies <2 GHz, with DVFS (Dynamic Voltage and Frequency Scaling) techniques bringing the core clock frequencies and the supply voltages $V_{DD}$ to the MHz and near-threshold regimes, respectively, there is a need to develop low-power clock distribution schemes that can work across increasingly wider operating ranges. While recent work in quasi-continuous resonant clocking have been proposed to intermittently cancel global clock tree capacitance during edge transitions, such techniques require large off-chip inductors and are limited to 0.98 MHz [H. Fuketa et al., "Intermittent Resonant Clocking Enabling Power Reduction at Any Clock Frequency for 0.37v 980 khz Near-Threshold Logic Circuits," *ISSCC Dig. Tech. Papers*, 2013] and 150 MHz [F. Rahman et al., "Voltage-Scalable Frequency-Independent Quasi-Resonant Clocking Implementation of a 0.7-to-1.2V DVFS System," *ISSCC Dig. Tech. Papers*, 2016], respectively, because of the need to operate well below resonance (i.e., $<<f_o/10$). Thus, while prior approaches have shown power reduction for targeted applications, these prior approaches all require large on- or off-chip magnetics, and do not meet the MHz-to-GHz frequency-range needs of modern DVFS-enabled SoCs.

FIGS. 1A-1C illustrate prior resonant clocking techniques, respectively including resonant clocking [Chan et al., supra; Restle et al., supra] intermittent resonant clocking (IRC) [Fuketa et al. supra] and quasi-resonant clocking (QRC) [Rahman et al., supra]. Such conventional approaches utilize an array of on-chip inductors (represented by the inductor in FIG. 1A) along with per-inductor decoupling capacitor (>10× $C_{CLK}$). Unfortunately, CLK power increases ~±20% away from resonance ($f_o$), thereby limiting DVFS opportunities. On the other hand, IRC and QRC techniques can enable DVFS up to $~f_o/10$ by employing large off-chip inductors (represented by the inductor in each of FIGS. 1B and 1C). However, such approaches can have severe ringing if accurate pulse width timing is not ensured, thereby requiring power-expensive timing logic overhead (e.g., delay-locked-loops, DLLs). Furthermore, special gate drivers or charge pumps are required to either boost the gate drive voltage of the footer NMOS in IRC techniques, or provide a $-V_{DD}/2$ gate drive for QRC footer transistor $M_f$, to ensure that it turns off before its drain voltage goes to $-V_{DD}/2$ (which is a further device reliability issue).

SUMMARY OF THE INVENTION

An embodiment of the invention is a method for adiabatic charging of a capacitive load that sequentially connects outer switches between a voltage $V_{DD}$ and ground and inner switches to at least one capacitance that self-balances to a voltage between $V_{DD}$ and ground. A voltage waveform is provided to the capacitive load from a common node of the outer switches and the inner switches. An adiabatic charging circuit of a preferred embodiment includes outer transistor switches connected between a voltage $V_{DD}$ and ground. Inner transistor switches are connected to at least one capacitance that self-balances to a voltage between $V_{DD}$ and ground. A common node connects the inner and outer transistor switches to a capacitive load. A control signal generating circuit generates control signals for the inner and outer transistor switches that sequentially turn the inner and outer switches on and off to create a multi-level voltage staircase waveform at the common node. In preferred embodiments, the adiabatic charging circuit consists of the inner and outer switches, the common node, the at least one capacitance and the control signal generating circuit. The capacitance used in preferred embodiments consists of one or more passive capacitors, and the adiabatic circuit can be implemented completely on-chip in preferred embodiments.

BRIEF DESCRIPTION OF THE DRAWINGS

FIGS. 5A-5C compare performance of the prototype to conventional clock signal generation approaches;

FIG. 7 is a table that compares performance of the prototype to state-of-the art prior clock generation circuits.

DETAILED DESCRIPTION OF THE PREFERRED EMBODIMENTS

Figure 1C:
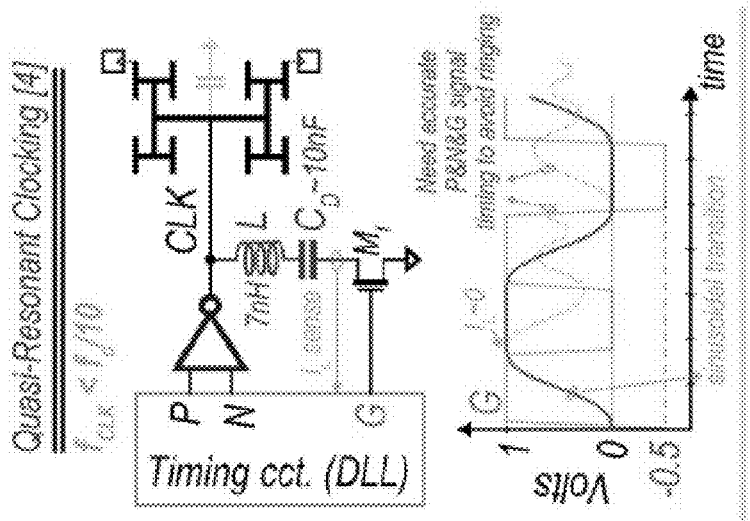
FIGS. 1A-1C (prior art) respectively illustrate prior resonant clocking, intermittent resonant clocking and quasi-resonant clocking approaches for aiding capacitive load charging of a clock tree.
Figure 1B:
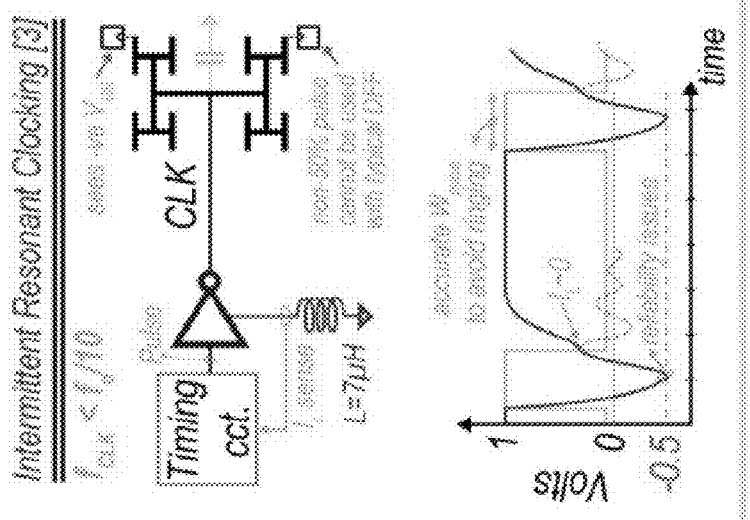
Figure 1A:
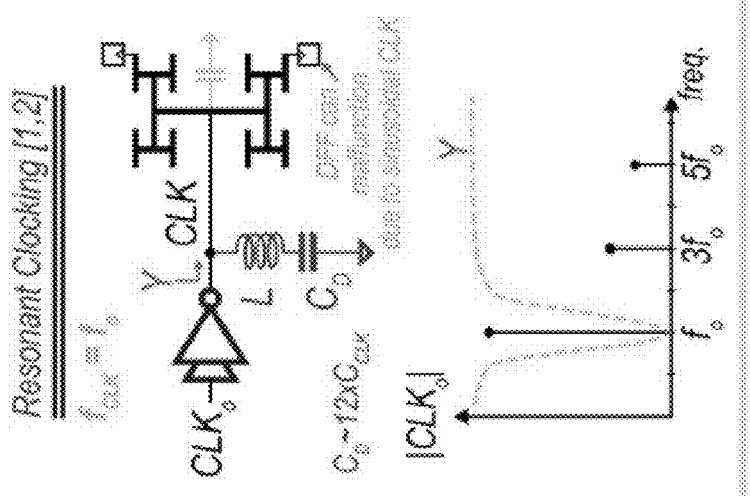

Preferred embodiments of the invention provide adiabatic charging via multiple levels in a small, efficient structure via a switched-capacitor circuit and method. The present inventors believe that this is the first practical approach that enables adiabatic charging in a practical solution. Experiments have demonstrated the multi-level adiabatic charging in a clocking application, while artisans will appreciate the general applicability to arbitrary capacitive loads. An example application of the invention demonstrates a fully-integrated adiabatic clocking scheme that efficiently synthesizes n-step clock waveforms from 1 MHz to 2 GHz via a switched-capacitor DC-AC multi-level inverter topology, theoretically reducing power by 1/n without using any magnetic components.

Preferred embodiments are used as on-chip adiabatic charging circuits, and are especially advantageous to on-chip implementations. However, the present invention is applicable in other circuits. Additional applications include on-chip pads, off-chip PCB traces, a neural stimulation electrodes—and any other applications that require a circuit to drive a capacitor via a voltage source.

Preferred embodiments of the invention will now be discussed with respect to the drawings and experimental devices. The drawings may include schematic representations, which will be understood by artisans in view of the general knowledge in the art and the description that follows. Features may be exaggerated in the drawings for emphasis, and features may not be to scale.

Figure 2B:
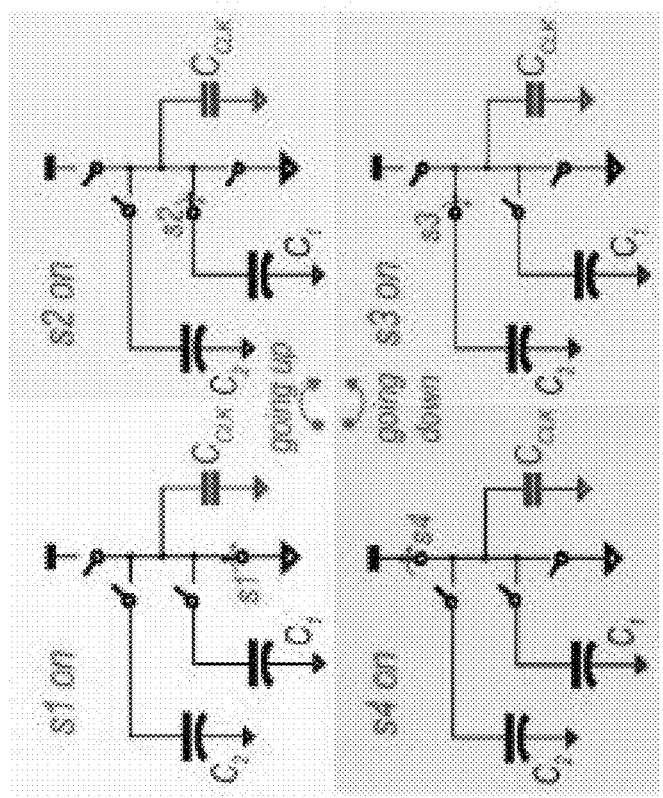
FIGS. 2A and 2B respectively illustrate a preferred on-chip adiabatic multi-level charging circuit and the switching states for stepwise charging and discharging of a load, such as a clock tree having a $C_{CLK}$ capacitance.
Figure 2A:
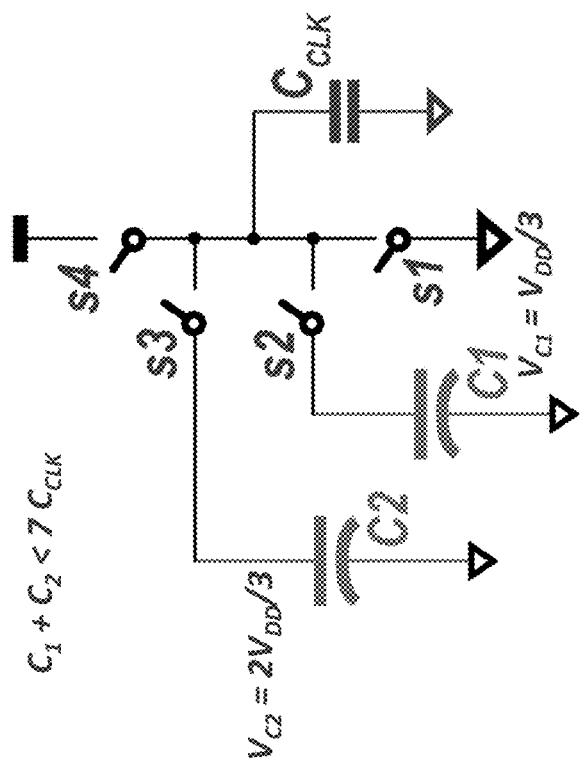

FIGS. 2A-2B illustrates a preferred on-chip integrated circuit for adiabatic charging. Unlike the prior approaches, clock power is reduced in the present approach through an adiabatic stepwise charging technique implemented using a 4-level switched-capacitor DC-AC inverter topology. In this approach, the CLK capacitance ($C_{CLK}$) (for example a clock tree, an on-chip pad, off-chip PCB trace, a neural stimulation electrodes—or another capacitive load) is step-wise charged by sequentially turning on switches s1, s2, s3, and s4, which creates a 4-level voltage staircase (more generally a multi-level staircase can be used) whose levels are set by GND, self-balanced capacitors $C_1$ and $C_2$, and $V_{DD}$. More levels can be added to the staircase by adding additional self-balanced capacitors and corresponding switches. Afterwards, CLK is brought down stepwise to GND in the reverse order. The switching sequence is illustrated in FIG. 2B. Theoretically, 4-level adiabatic charging reduces CLK power by 3×. By repeating the same operation periodically at $f_{CLK}$, a KVL-constrained multi-phase switched network is established, which inherently enforces $V_{L2}=V_{DD}/3$ and $V_{L3}=2/3V_{DD}$ without any explicit DC-DC converter. Both capacitors $C_1$ and $C_2$ are preferably on-chip capacitors, and no inductors or separate high-overhead timing circuits are required. The FIGS. 2A-2B adiabatic charging circuit is operable over a wide frequency range, for example from 1 MHz to 2 GHz.

Figure 3A:
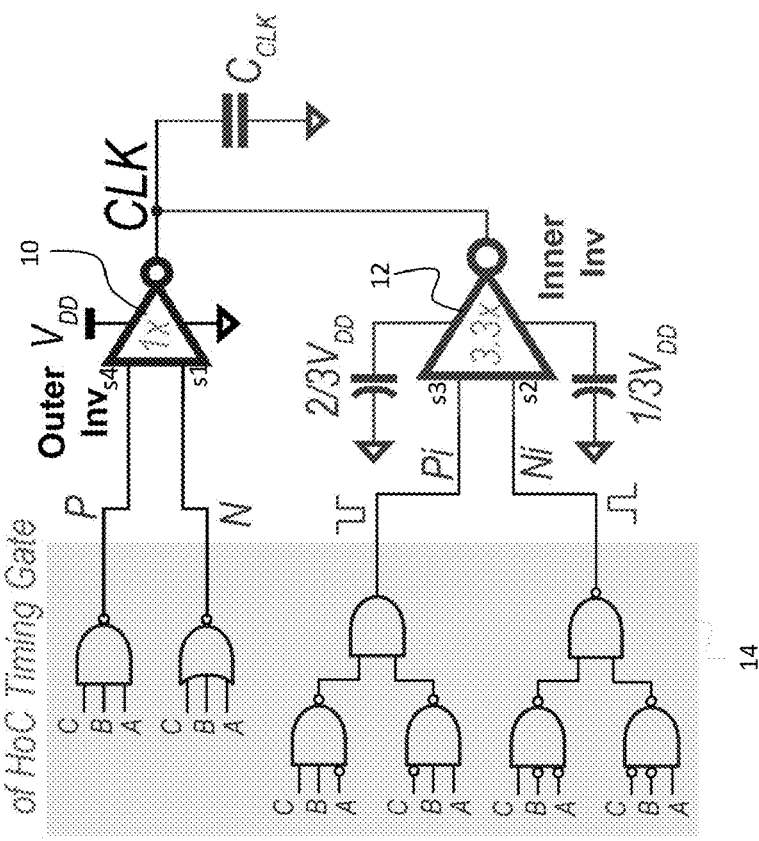
FIGS. 3A-3D illustrates a preferred reconfigurable 4-level inverter to implement the FIG. 2A adiabatic multi-level circuit and waveforms for 4-Level and 3-Level Clock modes

FIG. 3A illustrates an implementation of the FIG. 2A adiabatic charging circuit, which includes (and preferably consists of) two standard CMOS inverters 10 and 12 whose outputs are tied together: the outer power inverter 10 powered between $V_{DD}$ and GND, and the inner power inverter 12 with a floating supply and ground at $2/3V_{DD}$ and $1/3V_{DD}$, respectively. The outer inverter is controlled by signals P and N, periodically connecting its output to $V_{DD}$ or GND, while the inner inverter is controlled by signals Pi and Ni, periodically connecting its output to $2/3V_{DD}$ or $V_{DD}/3$. This ratio changes with different numbers of self-balancing capacitors, for example, connecting C1 and C2 together reduces the number of voltage steps available to three steps, and the ratio is then $1/2V_{DD}$. Increasing to 5 steps, requires another capacitor C3 (not shown) and another switch s5 (not shown), and the ratios would then be multiples of $1/4V_{DD}$. Increasing to 6 steps similarly creates ratios of multiples of $1/5V_{DD}$. Other switched-capacitor topologies are also possible to generate other ratios.

Figure 3B:
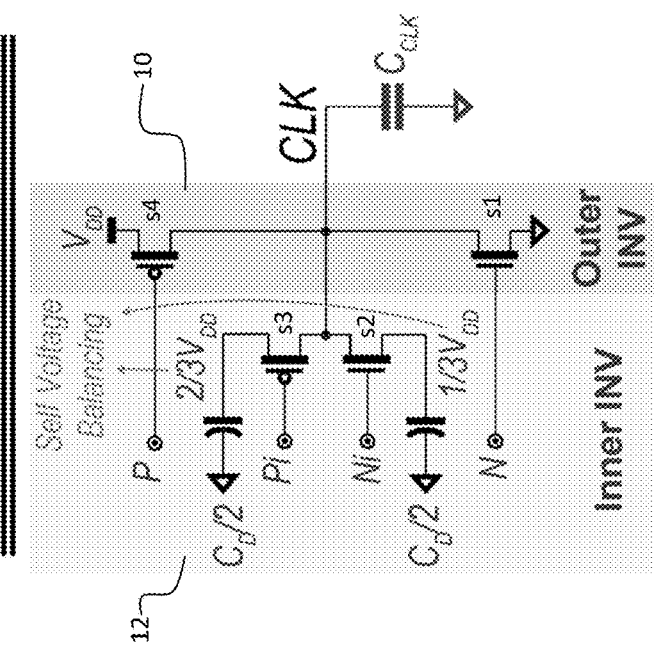
Figure 3D:
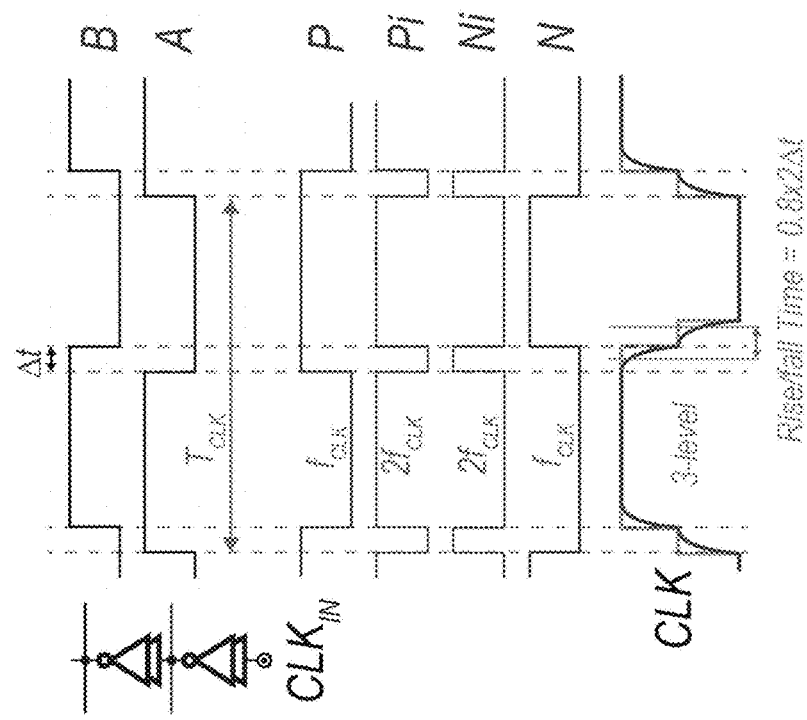

In a preferred embodiment shown in FIG. 3B, the four P, N, Pi, Ni control signals are generated by passing the input clock through a tunable chain of inverters, producing three signals, A, B, and C, with equal delay times between the three signals, Δt, and passing these signals through a "House-of-Cards" (HoC) timing gate 14 (whose operation is logically represented by 8 combinational gates in FIG. 3). To enable adiabatic charging, the switch's $R_{on}/W_{sw}$ (switches s1-s4) should be set such that the $RC_{CLK}$ time constant, T, is less than Δt/1.4. In FIG. 3B, the inverter providing the outer voltage inverter 10 is 1× and the inverter providing the inner voltage inverter 12 is 3.3×, indicating that the NMOS devices in the 3.3× inverter 12 are 3.3 times larger than the transistors in the 1× inverter 10. A design guideline for the 4-level voltage inverter is a total of ~$6.7C_{CLK}$ of self-balancing capacitance, which is 1.8× lower than the capacitance required in conventional resonant schemes. By 4-level, this means that there are four steps in the staircase rise and file of the charging CLK output, as shown in the timing diagram of FIG. 3C. The 4-level inverter can be operated as a 3-level inverter by overlapping pulses Ni, Pi, as shown in FIG. 3D, coarsely decreasing the 10-90% rise/fall time from 0.8×3Δt to 0.8×2Δt; fine rise/fall time configuration can be adjusted via the tunable delay chain. The 4-level inverter can also be operated as a standard 2-level CMOS inverter by disabling the inner inverter.

Figure 3C:
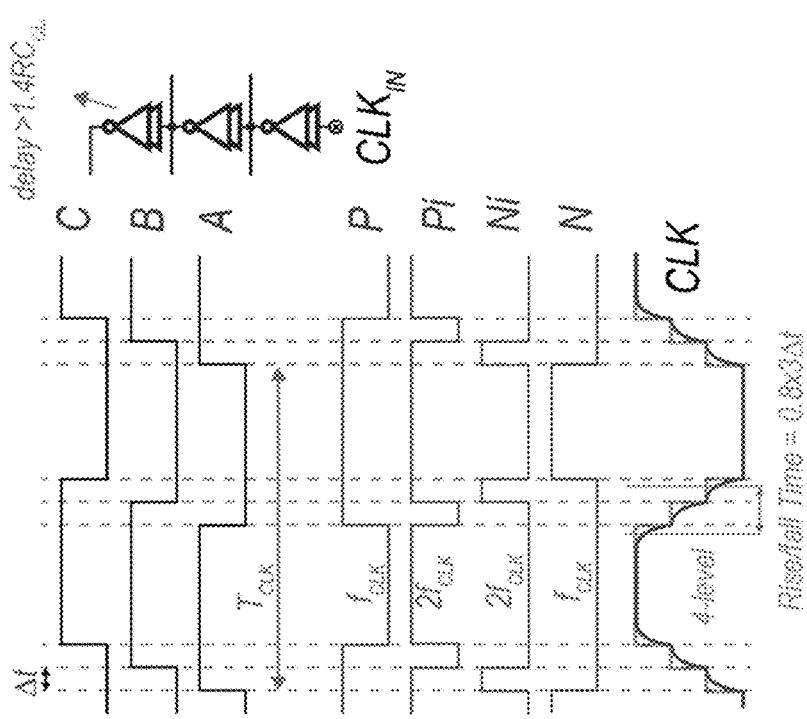
Figure 4A:
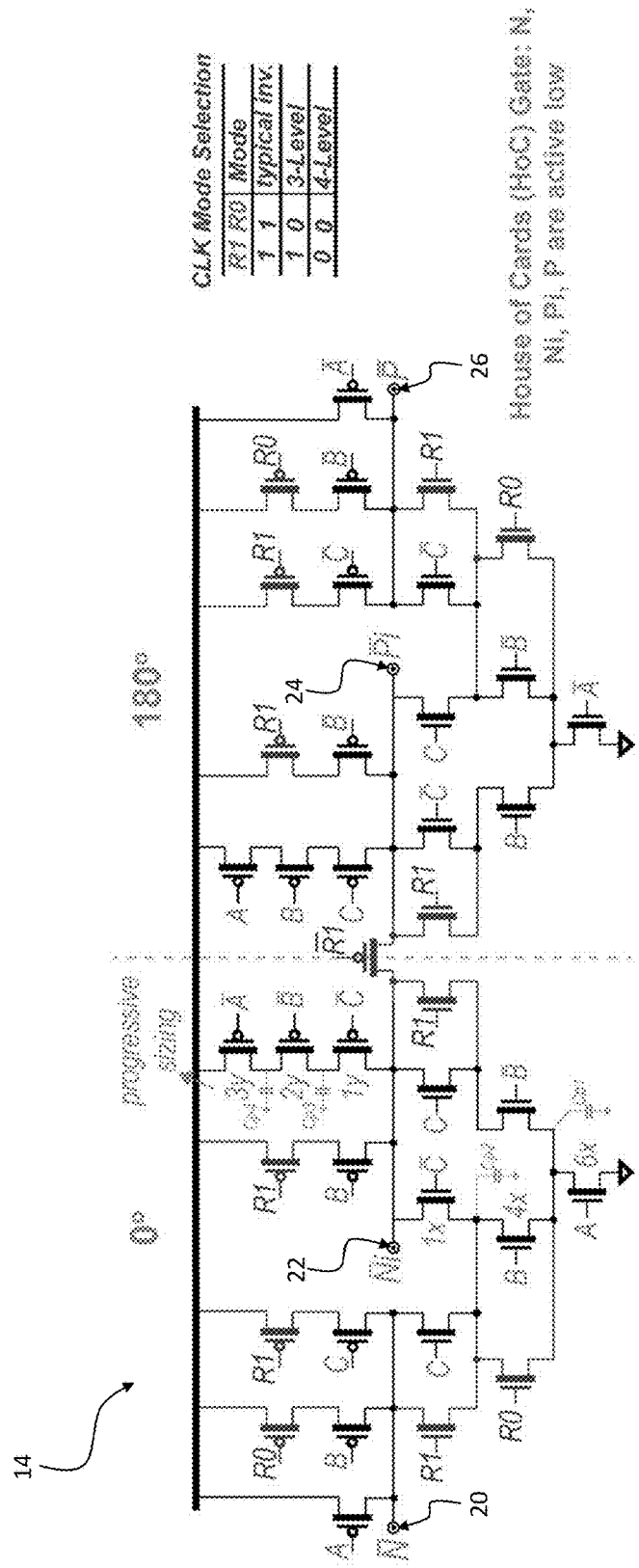
FIGS. 4A-4C illustrate a preferred prototype implementation of the FIGS. 3A-3D reconfigurable inverter.

FIG. 4A shows an example prototype implementation of the HoC timing gate 14, optimized to generate the inverse of N, Ni, Pi, and P at respective nodes 20, 22, 24, and 26 with non-overlapping properties in minimal area and power. With reference to the 0° side, the common "root" is the 6× A transistor, and the transistors above it are its leaves. Similarly, the transistor with input B and size 4× can be considered a "root" to transistors above it. Non-overlapping pulses are inherently generated in the HoC 14 gate since, when the leaves of the HoC tree turn on, the output pulses must wait until the common root in the tree is charged or discharged. For instance, suppose that ABC=110, thereby $\overline{Ni}$=0. Then, if C transitions from 0→1, $C_{p1}$ and $C_p$ ($C_{p3}$ and $C_{p4}$) are already discharged (charged) when the $C/\overline{C}$ edge arrives, and hence all controlling pulses (N, Ni, Pi, P) are synchronized without overlap. The HoC gate can be folded to support 4-, 3-, or 2-level timing signals via configuration bits R1 and R0, per the truth table. Respectively 1, 1 is typical inverter operations, 1, 0 is 3-Level operation (FIG. 3D), and 0, 0 is the 4-Level operation (FIG. 3C).

Figure 4B:
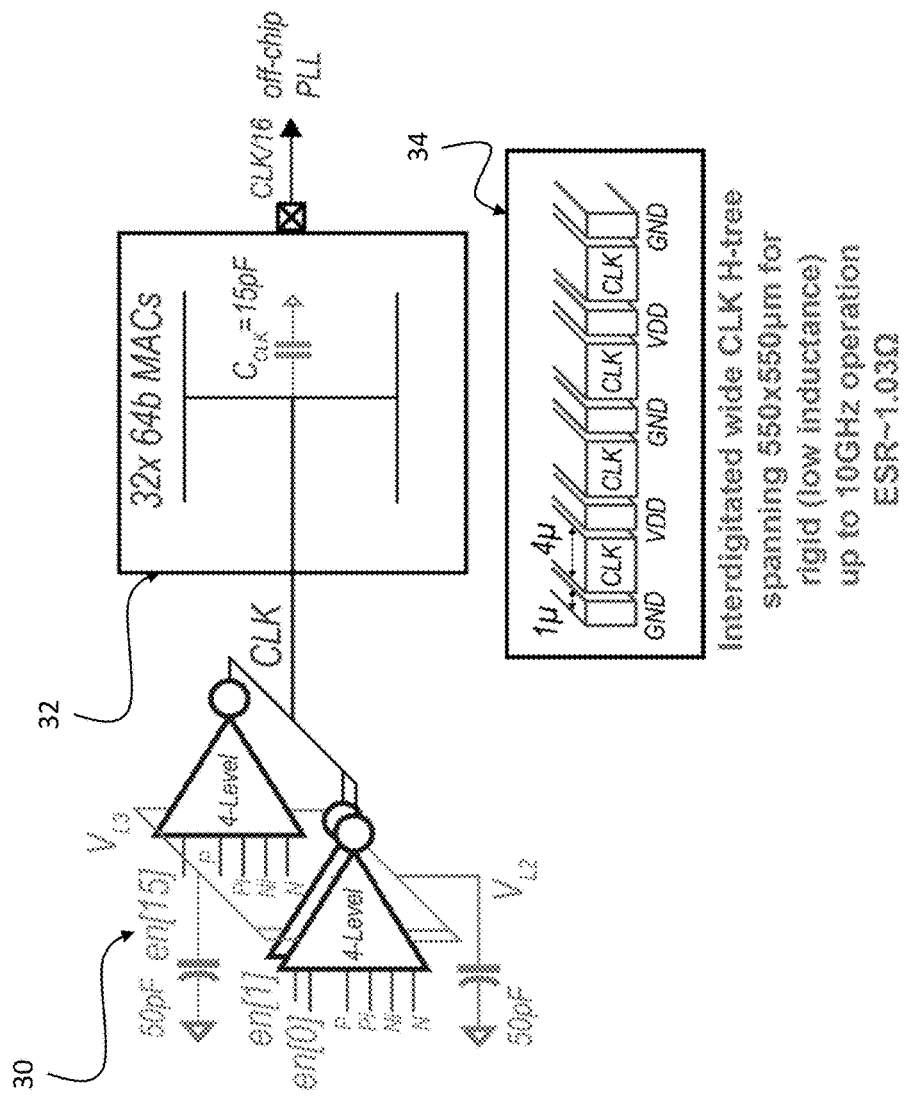
Figure 4C:
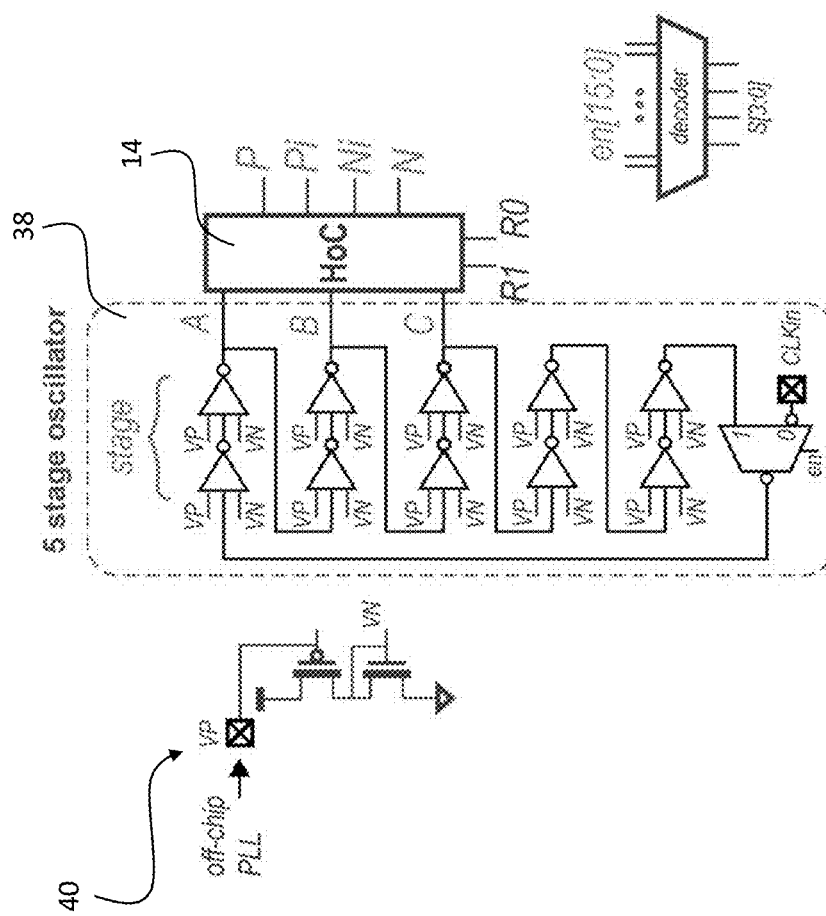

FIG. 4B shows an overall architecture of the preferred example adiabatic clocking prototype. A 4b programmable-strength reconfigurable 4-level power inverter 30 is implemented having 16 slices, where all 16 slices share the same $V_{L2}$ and $V_{L3}$ nodes, each connected to 50 pF of on-chip thick-oxide capacitance and providing the clock CLK to a clock tree 32, which has the interdigitated form 34 of a 5-level H-tree spanning 550×550 μm to provide low inductance up to 10 GHz operation with an ESR of ~1.03Ω. Slices were used for experimental purposes, and to allow reconfiguring the "drive strength" (i.e., the size the transistors in the inverters) on the fly, for example to reduce switching losses, or to drive different amounts of capacitance. An on-chip current starved oscillator 38 in FIG. 4C, locked through an off-chip PLL 40 is employed as the clock source. To ensure sufficient rise/fall time for adiabatic operation up to 2 GHz, phases A, B, C are provided from the first 3 stages in the 5-stage ring oscillator 38 such that the adiabatic CLK 10-90% (20-80%) rise/fall time is <<24% (<<18%) of the CLK period. The 4-level inverter drives the clock tree 32 that is 32× pipelined array of 64b MACs (multiply—accumulate circuits used as a test circuit). Capacitance from digital logic, CLK wiring, and drain parasitics of the driver totals $C_{CLK} \approx 15$ pF (2:1:1).

Fabricated in 9M 45 nm SOI the prototype global clock distribution, spanning $A_{LOAD}$=550×550 μm², takes the form of a tree-driven grid. The clock tree and grid (as well as the power distribution) occupy the top 2 UT metals M9 and M8, respectively. Each line of the 5-level H-tree is split into multiple fingers in the interdigitated form 34 as shown in FIG. 4B to reduce inductance and enable rigid operation up to 10 GHz. The adiabatic driver, including self-balancing capacitors, occupies only 0.0187 mm² (<6.2% of $A_{LOAD}$). To quantify the improvement over conventional clocking, the driver is configured into the 2-level mode with reduced drive strength for identical rise/fall time to the 3/4-level modes, while multi-level overhead circuits are off.

Measurement results at 1V in FIG. 5A indicate 4-level (3-level) clock power savings of at least 42% (28.4%) from 10 MHz-2 GHz while successfully operating a digital load, with 55.6% (45.5%) peak savings at 10 MHz where adiabatic clocking overhead is minimal At 0.4V near-threshold operation (FIG. 5B), 4-level (3-level) clocking successfully achieves a measured power savings of at least 34.4% (22.5%) from 1 MHz-267 MHz. FIG. 5C shows the measured CLK driver energy under DVFS operation between 0.4-1V, showing above 39.4% savings across the entire DVFS range, with 46.5% peak savings.

Figure 6A:
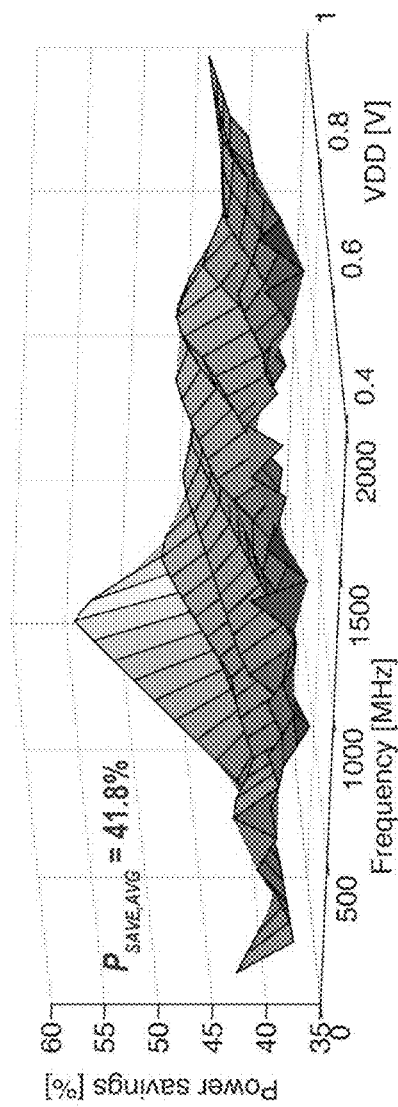
FIGS. 6A-6B are respectively performance comparison data and example waveforms of the prototype.
Figure 6B:
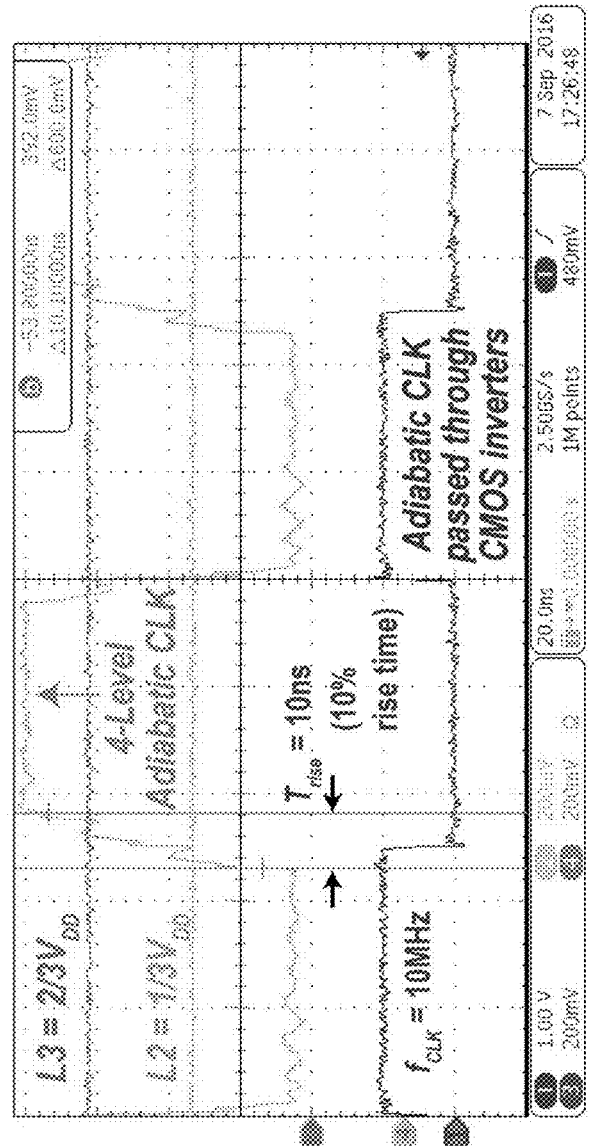

FIG. 6A shows the measured power savings across all possible voltages and frequencies, indicating a 41.8% average savings across a 2000× dynamic frequency range. The measured transient waveforms of the 4-level operation at 10 MHz from a 1V supply is shown in FIG. 6B, via both a common-source PMOS analog buffer (open-drain driver) biased by 25Ω (50Ω on PCB and 50Ω input of a sampling scope) for 0.75 V/V gain, and a cascaded inverter chain. FIG. 7 compares the present prototype to the state-of-the-art clocking schemes, demonstrating the widest adiabatic frequency and supply voltage dynamic ranges with the highest clock power savings, all with minimal overhead. The state-of-the art examples [1]-[4] of the table in FIG. 7 are listed in the reference list below.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

REFERENCES

[1] S. Chan et al., "A 4.6 GHz Resonant Global Clock Distribution Network," *ISSCC Dig. Tech. Papers*, 2004.
[2] P. Restle et al., "Wide-Frequency-Range Resonant Clock with On-The-Fly Mode Changing for the POWER8™ Microprocessor," *ISSCC Dig. Tech. Papers*, 2014.
[3] H. Fuketa et al., "Intermittent Resonant Clocking Enabling Power Reduction at Any Clock Frequency for 0.37v 980 khz Near-Threshold Logic Circuits," *ISSCC Dig. Tech. Papers*, 2013.
[4] F. Rahman et al., "Voltage-Scalable Frequency-Independent Quasi-Resonant Clocking Implementation of a 0.7-to-1.2V DVFS System," *ISSCC Dig. Tech. Papers*, 2016.

The invention claimed is:

1. An adiabatic charging circuit, comprising:
outer transistor switches between a voltage VDD and ground;
inner transistor switches connected to at least one capacitance self-balanced at a level between VDD and ground;
a common node of the outer and inner transistor switches and a capacitive load; and
a control signal generating circuit to generate control signals for the inner and outer transistor switches that sequentially turn the inner and outer switches on and off to create a multi-level voltage staircase waveform at the common node, wherein the outer transistor switches comprise a first inverter and a second inverter whose outputs are tied together at the common node, the first inverter being powered between the voltage $V_{DD}$ and ground and the second inverter being connected to the at least one capacitance, and wherein the at least one capacitance comprises two separate capacitances self-balanced at two different levels between $V_{DD}$ and ground, and the separate capacitances respectively charge to voltages of 2/3 $V_{DD}$ and 1/3 $V_{DD}$.

2. An adiabatic charging circuit, comprising:
outer transistor switches between a voltage VDD and ground;
inner transistor switches connected to at least one capacitance self-balanced at a level between VDD and ground;
a common node of the outer and inner transistor switches and a capacitive load; and
a control signal generating circuit to generate control signals for the inner and outer transistor switches that sequentially turn the inner and outer switches on and off to create a multi-level voltage staircase waveform at the common node, wherein the outer transistor switches comprise a first inverter and a second inverter whose outputs are tied together at the common node, the first inverter being powered between the voltage $V_{DD}$ and ground and the second inverter being connected to the at least one capacitance, and wherein the second inverter comprises NMOS transistors sized 3× of NMOS transistors in the first inverter.

3. An adiabatic charging circuit, comprising:
outer transistor switches between a voltage VDD and ground;
inner transistor switches connected to at least one capacitance self-balanced at a level between VDD and ground;

a common node of the outer and inner transistor switches and a capacitive load; and a control signal generating circuit to generate control signals for the inner and outer transistor switches that sequentially turn the inner and outer switches on and off to create a multi-level voltage staircase waveform at the common node, wherein the capacitive load comprises one of an on-chip pad, an off-chip PCB trace or a neural stimulation electrode.

4. The charging circuit of claim 3, wherein the outer transistor switches comprise a first inverter and a second inverter whose outputs are tied together at the common node, the first inverter being powered between the voltage $V_{DD}$ and ground and the second inverter being connected to the at least one capacitance.

5. The charging circuit of claim 3, wherein the at least one capacitance consists of one or more passive capacitors.

6. An adiabatic charging circuit, comprising:
outer transistor switches between a voltage VDD and ground;
inner transistor switches connected to at least one capacitance self-balanced at a level between VDD and ground;
a common node of the outer and inner transistor switches and a capacitive load; and
a control signal generating circuit to generate control signals for the inner and outer transistor switches that sequentially turn the inner and outer switches on and off to create a multi-level voltage staircase waveform at the common node, wherein the control generating circuit comprises a tunable chain of inverters producing three signals, A, B, and C, with equal delay times, Δt, and a timing gate that receives A, B, and C and generates four sequential control signals for the inner and outer transistor switches.

7. The charging circuit of claim 6, wherein the timing gate comprises a House-of-Cards timing gate.

8. The charging circuit of claim 6, consisting of the inner and outer switches, the common node, the at least one capacitance, and the control signal generating circuit.

9. An adiabatic charging circuit, comprising:
outer transistor switches between a voltage VDD and ground;
inner transistor switches connected to at least one capacitance self-balanced at a level between VDD and ground;
a common node of the outer and inner transistor switches and a capacitive load; and
a control signal generating circuit to generate control signals for the inner and outer transistor switches that sequentially turn the inner and outer switches on and off to create a multi-level voltage staircase waveform at the common node, wherein the capacitive load comprises an H-clock tree.

10. The charging circuit of claim 9, wherein the outer transistor switches consist of a first inverter and a second inverter whose outputs are tied together at the common node, the first inverter being powered between the voltage $V_{DD}$ and ground and the second inverter being connected to the at least one capacitance.

11. An adiabatic charging circuit for charging a capacitive load connected to a node, comprising:
first means for providing voltage to the node from a voltage source $V_{DD}$;
second means for providing no voltage to the node;
third means for providing a capacitive stored voltage to the node; and
means for sequencing the first means, second means and the third means to create a staircase voltage waveform at the node, the capacitive load comprising means for distributing a clock signal.

* * * * *